(12) United States Patent
Qiu et al.

(10) Patent No.: US 8,324,663 B2
(45) Date of Patent: Dec. 4, 2012

(54) AREA EFFICIENT HIGH-SPEED DUAL ONE-TIME PROGRAMMABLE DIFFERENTIAL BIT CELL

(75) Inventors: Yunchen Qiu, Plano, TX (US); Harold L. Davis, The Colony, TX (US)

(73) Assignee: Texas Instruments Incorporated, Dallas, TX (US)

( * ) Notice: Subject to any disclaimer, the term of this patent is extended or adjusted under 35 U.S.C. 154(b) by 82 days.

(21) Appl. No.: 13/078,416

(22) Filed: Apr. 1, 2011

(65) Prior Publication Data
US 2012/0248538 A1    Oct. 4, 2012

(51) Int. Cl.
*H01L 23/52*   (2006.01)
*H01L 21/82*   (2006.01)
(52) U.S. Cl. ..................... 257/209; 438/129
(58) Field of Classification Search .......... 257/202–211, 257/394, 903; 438/128, 129
See application file for complete search history.

(56) References Cited

U.S. PATENT DOCUMENTS

| | | | |
|---|---|---|---|
| 6,297,668 B1 * | 10/2001 | Schober | 326/101 |
| 6,509,606 B1 | 1/2003 | Merrill et al. | |
| 6,611,009 B2 * | 8/2003 | Lim | 257/208 |
| 6,639,270 B2 | 10/2003 | Dray | |
| 6,770,933 B2 | 8/2004 | Mitros | |
| 6,897,113 B2 | 5/2005 | Mitros | |
| 7,402,874 B2 | 7/2008 | Wu | |
| 7,602,029 B2 | 10/2009 | Mallikararjunaswamy | |
| 7,675,106 B2 | 3/2010 | Bouchakour et al. | |
| 2002/0175353 A1 | 11/2002 | Dray et al. | |

* cited by examiner

*Primary Examiner* — Calvin Lee
(74) *Attorney, Agent, or Firm* — John J. Patti; Wade J. Brady, III; Frederick J. Telecky, Jr.

(57) ABSTRACT

One-time programmable (OTP) Electronically Programmable Read-Only Memories (EPROMs) have been used in a number of applications for many years. One drawback with these OTP EPROMs is that these nonvolatile memories tend to be slow and/or may use a considerable amount of area. Here, however, a bit cell is provided that employs a compact dual cell, which generally includes two OTP cells. These OTP cells are generally arranged in differential configuration to increase speed and are arranged to have a small impact on area.

12 Claims, 12 Drawing Sheets

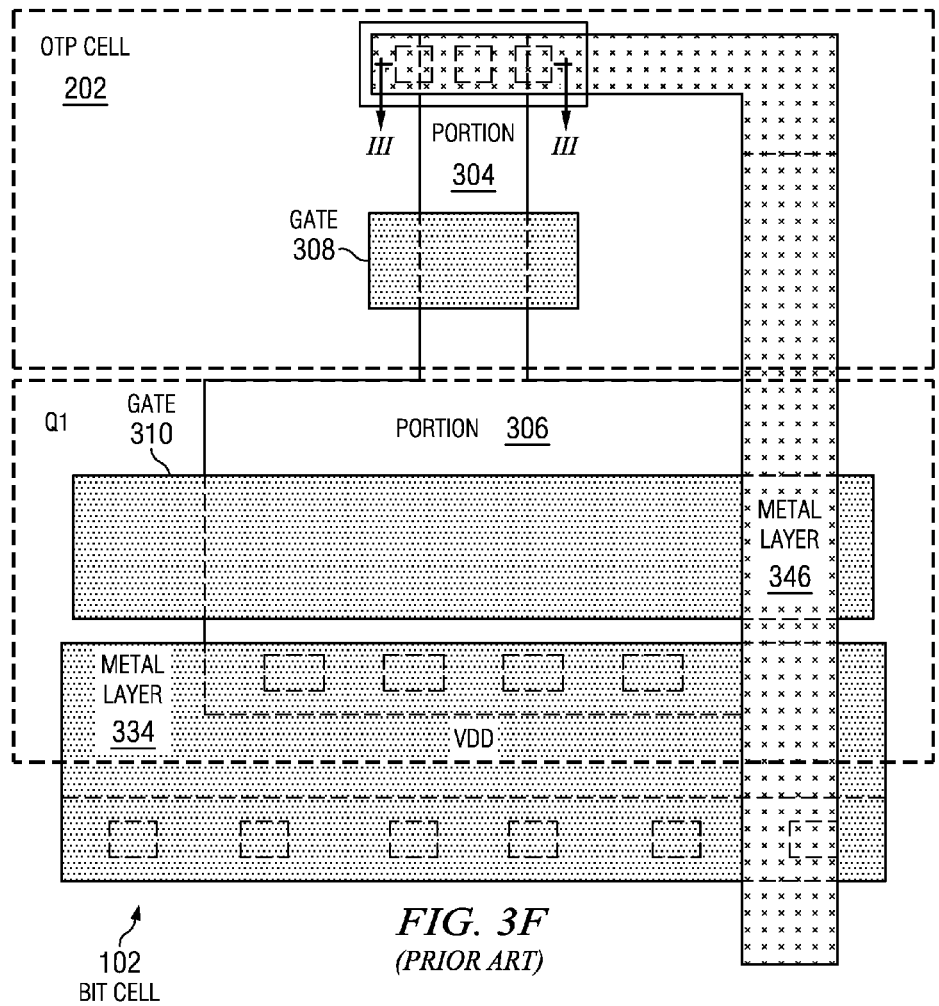
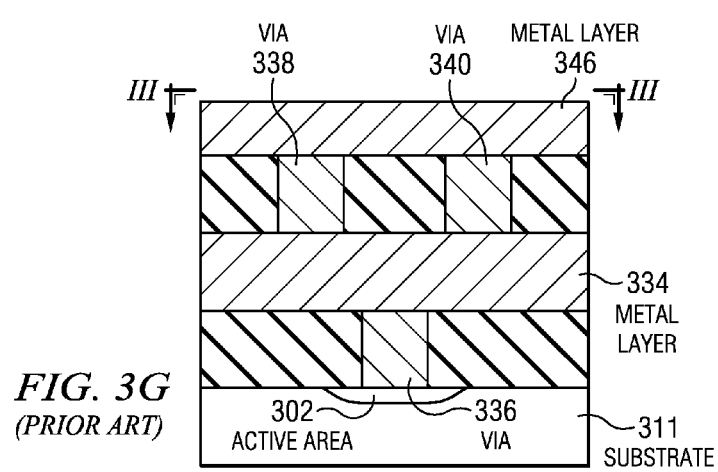
FIG. 3G
(PRIOR ART)

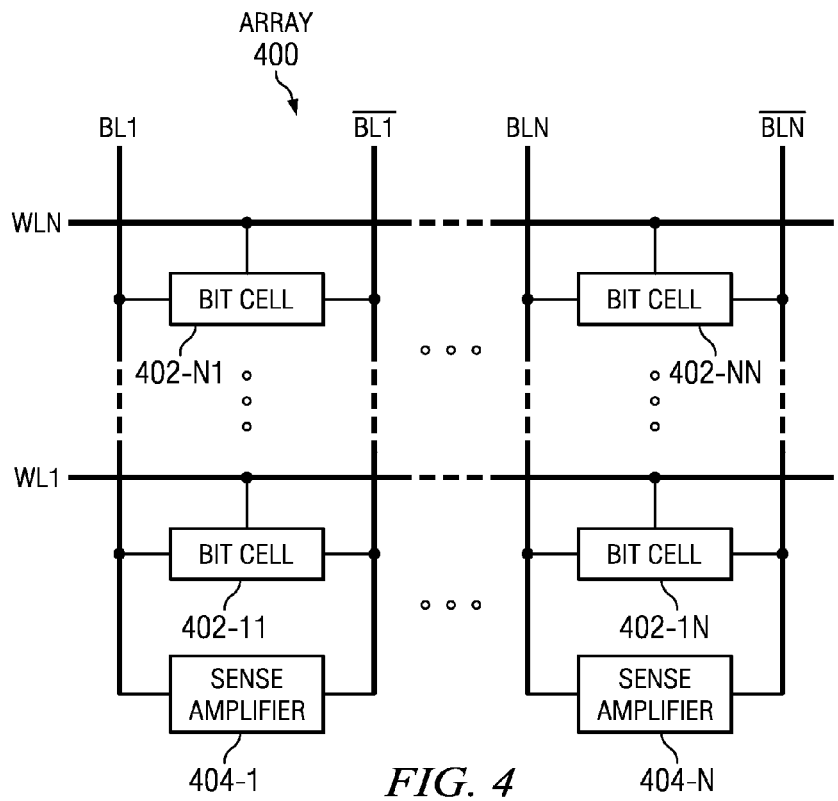
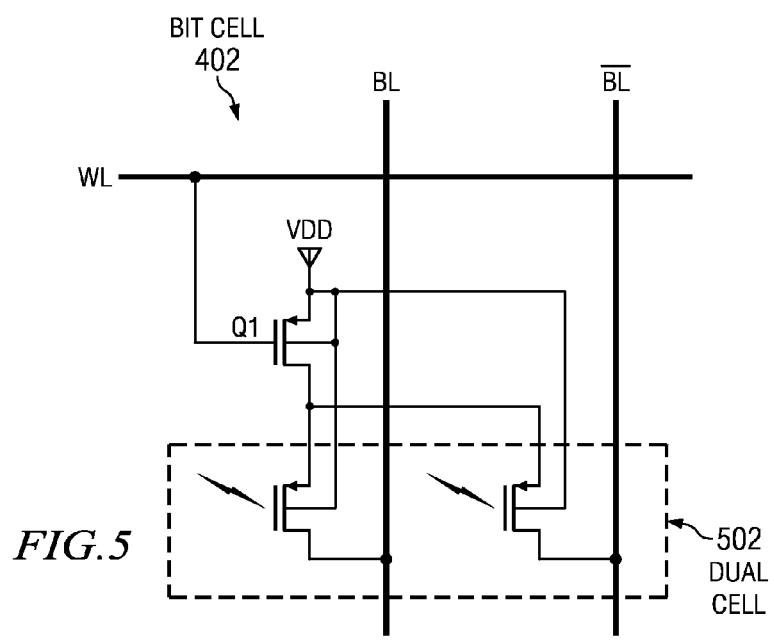

AREA EFFICIENT HIGH-SPEED DUAL ONE-TIME PROGRAMMABLE DIFFERENTIAL BIT CELL

TECHNICAL FIELD

The invention relates generally to a one-time programmable (OTP) bit cell and, more particularly, to a dual OTP differential bit cell.

BACKGROUND

Electronically Programmable Read-Only Memories (EPROMs) have been used for a number of applications for many years, and OTP EPROMs have been used as an effective, low-cost technology for providing embedded nonvolatile memory. These nonvolatile memories are generally formed using an OTP element, cell, or transistor. Typically, this OTP cell is (for example) an enhancement-mode PMOS with a floating gate (typically made of polysilicon). It can be electrically programmed and can be erased through expose to light in the ultraviolet (UV) spectrum. Typically, a programmed OTP cell is an "on cell" and will conduct current, while an erased OTP cell is an "off cell" and does not conduct current. As shown in the example of FIG. 1, an EPROM is generally comprised of an array 100 of bit cells 102-11 to 102-NN, which can be erased by UV light. These bit cells 102-11 to 102-NN are accessed through word lines WL1 to WLN and bit lines BL1 to BL-N; in particular, sense amplifier 104-1 to 104-N are used to read the array 100 through the bit lines BL-1 to BL-N.

To accomplish the nonvolatile functionality of the array 100, each bit cell employs an OTP cell or transistor. Turning to FIG. 2, an example of one of the bit cells 102-11 to 102-NN (hereinafter 102) which is coupled to one of the word lines WL1 to WLN (hereinafter WL) and one of the bit lines BL1 to BLN (hereinafter BL). As shown, the bit cell 102 generally comprises a transistor Q1 (which can be, for example, a PMOS transistor) and an OTP cell 202 (which can, for example, be a PMOS OTP cell).

Turning to FIGS. 3A to 3G, the layout for the bit cell 102 of FIG. 2 on substrate 311 can be seen. As shown, the bit cell 102 employs an active area 302 that is used for both the transistor Q1 (which uses portion 306) and OTP cell 202 (which uses portion 304). Gates 308 and 310 are formed over these portions 304 and 306 (respectively), separating the source/drain regions 316/318 and 326/328 (respectively). These gates 312 and 322 are generally formed of a gate dielectric layer 314 and 344, respectively, (which can, for example, be silicon dioxide or a high-K dielectric, like halfnium oxide) and a gate electrode 312 and 322, respectively (which may be a single or dual layer polysilicon gate) that are surrounded by a interlayer dielectric 320 (which may be, for example, silicon dioxide). The drain of the OTP cell 202 (i.e., source/drain region 316) is coupled to the bit BL (which is formed by a portion of metal layer 346) through vias 336, 338 and 340 and strap (which is generally formed by a portion of metal layer 334), and the source of transistor Q1 (i.e., source/drain region 328) is electrically coupled to supply voltage VDD (which is supplied on metal layer 334) through vias 336, while substrate diffusion 344 (which generally functions as body contacts) is electrically coupled to supply voltage VDD through vias 342.

There are some drawbacks for this arrangement. OTP cells are commonly used for circuit trimming, die ID, and other areas requiring relatively small amounts of data storage. High speed is usually not required when reading a typical OTP. For an existing process, to achieve near 0 Defect Parts Per Million (dppm), the process corners should cover more than 6 standard deviations or 6-sigma. A 6-sigma process is one in which 99.99966% (i.e., 3.4 defects per million) of the products manufactured are expected to be free of defects after 10 years. Tests and measurements show that after 10 years, the programmed OTP bit cell is very weak due to charge loss from the floating gate. For example, the OTP transistor "on cell" current, $I_{ON}$, can drop from about 25 uA to less than 5 uA after 10 years. The drop in current $I_{ON}$ significantly slows down the sense amplifier (i.e., 104-1) sensing speed. Thus, the bit cell 102 (being a single-ended cell) will become significantly slower over time. To compensate for this degradation over time, a differential sensing implementation can be used. When sensing a single cell (i.e., bit cell 102) differentially, the selected bit line is compared with a reference voltage or current. So, a very accurate reference is used for the comparison, which can be very difficult to accomplish and which can consume a large amount of area. Another way to perform differential sensing, which avoids the very accurate reference, is to use two bit cells (i.e., bit cell 102) for one bit of data, where one bit cell is programmed with true data and the other bit cell is programmed with complement data. However, this approach uses twice the area of a single bit cell. Therefore, there is a need for an improved bit cell.

Some examples of other conventional systems are: U.S. Pat. No. 6,509,606; U.S. Pat. No. 6,639,270; U.S. Pat. No. 6,770,933; U.S. Pat. No. 6,897,113; U.S. Pat. No. 7,402,874; U.S. Pat. No. 7,602,029; U.S. Pat. No. 7,675,106; U.S. Patent Pre-Grant Publ. No. 2002/0175353.

SUMMARY

An embodiment of the present invention, accordingly, provides an apparatus. The apparatus comprises a substrate; a MOS transistor having: a first portion of an active area formed in the substrate that includes a first source/drain region and a second source/drain, wherein the first portion is substantially rectangular; and a first gate formed over the substrate between the first and second source/drain regions; and a dual one-time programmable (OTP) cell having: a second portion of the active area formed in the substrate that includes a third source/drain region and a fourth source/drain, wherein the third source/drain region is electrically coupled to the second source/drain region, and wherein the second portion is substantially rectangular; a third portion of the active area formed in the substrate that includes a fifth source/drain region and a sixth source/drain, wherein the fifth source/drain region is electrically coupled to the second source/drain region, and wherein the second portion is substantially rectangular, and wherein the third portion is substantially parallel to the second portion to one another, and wherein each of the second and third portions are formed adjacent to opposite ends of the first portion; a second gate formed over the substrate between the third and fourth source/drain regions; and a third gate on the substrate between the fifth and sixth source/drain regions.

In accordance with an embodiment of the present invention, each of the first, second, and third gates further comprise: a gate dielectric formed over the substrate; and a gate electrode formed over the gate dielectric.

In accordance with an embodiment of the present invention, the gate electrode further comprises polysilicon.

In accordance with an embodiment of the present invention, the apparatus further comprises a metal layer formed over the substrate that is electrically coupled to the first source/drain region of the MOS transistor so as to provide a supply voltage In accordance with an embodiment of the present invention, wherein the metal layer further comprises a first metal layer, and wherein the apparatus further comprises a second metal layer formed over the substrate having a bit line and an bitbar line, wherein the bit line is electrically coupled to the fourth source/drain region, and wherein the bitbar line is electrically coupled to the sixth source/drain region.

In accordance with an embodiment of the present invention, the MOS transistor is a PMOS transistor.

In accordance with an embodiment of the present invention, an apparatus comprising: a substrate; a plurality of word lines; a plurality of pairs of bits lines, wherein each pair bit lines is generally perpendicular to each word line; an array of bit cells, wherein each bit cell includes: a MOS transistor having: a first portion of an active area formed in the substrate that includes a first source/drain region and a second source/drain, wherein the first portion is substantially rectangular; and a first gate formed over the substrate between the first and second source/drain regions, wherein the first gate is electrically coupled to at least one of the word lines; and a dual OTP cell having: a second portion of the active area formed in the substrate that includes a third source/drain region and a fourth source/drain, wherein the third source/drain region is electrically coupled to the second source/drain region, and wherein the second portion is substantially rectangular; a third portion of the active area formed in the substrate that includes a fifth source/drain region and a sixth source/drain, wherein the fifth source/drain region is electrically coupled to the second source/drain region, and wherein the second portion is substantially rectangular, and wherein the third portion is substantially parallel to the second portion to one another, and wherein each of the second and third portions are formed adjacent to opposite ends of the first portion; a second gate formed over the substrate between the third and fourth source/drain regions; a third gate on the substrate between the fifth and sixth source/drain regions, wherein the second and third gates are each electrically coupled to one of the bit lines from at least one of the plurality of bit lines; and a window formed over the second and third gates, wherein the window is formed of a material that is substantially transparent to at least a portion of the ultraviolet spectrum.

In accordance with an embodiment of the present invention, the apparatus further comprises a metal layer formed over the substrate that is electrically coupled to the first source/drain region of the MOS transistor of each bit cell so as to provide a supply voltage.

In accordance with an embodiment of the present invention, the metal layer further comprises a first metal layer, and wherein the apparatus further comprises a second metal layer formed over the substrate that forms the plurality of bit line pairs.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A, and 3D through 3F are diagrams of an example of layout of the bit cell of FIG. 2;

FIGS. 3B and 3G are cross-sectional views of the OTP cell of FIG. 2 along section lines I-I and III-III, respectively;

FIG. 4 is a diagram of an example of an EPROM array in accordance with an embodiment of the present invention;

FIG. 5 is a diagram of an example of a bit cell of the array of FIG. 4;

DETAILED DESCRIPTION

Figure 1:
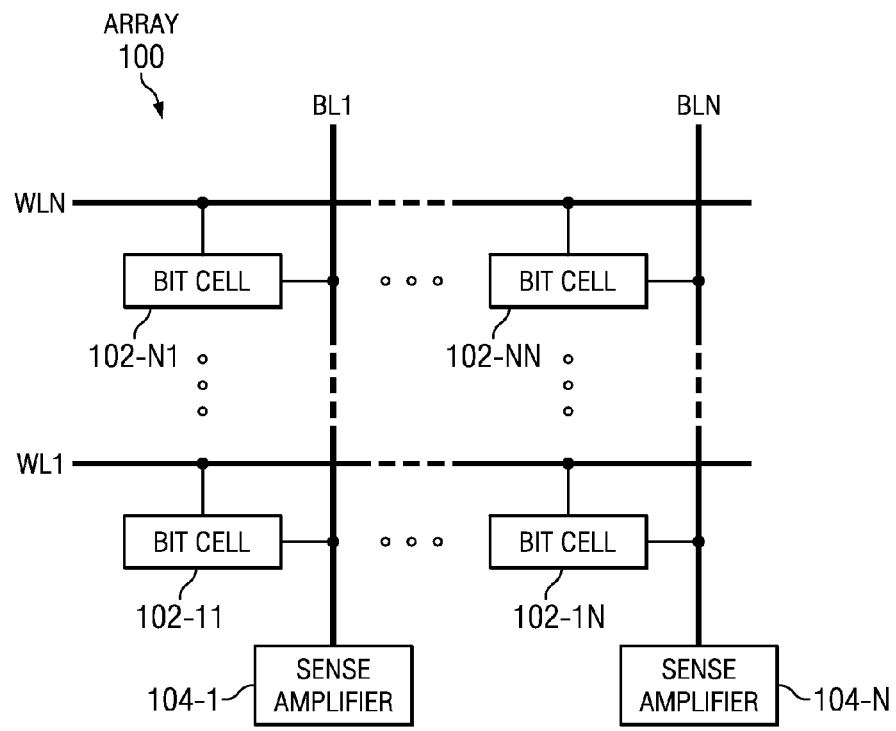
FIG. 1 is a diagram of an example of an EPROM array.
Figure 2:
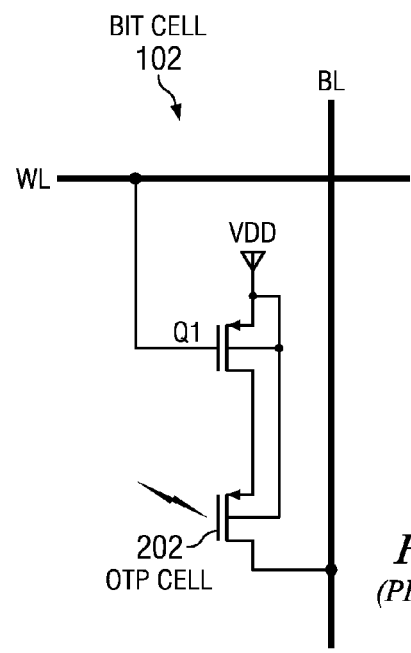
FIG. 2 is a diagram of an example of a bit cell of the array of FIG. 1.
Figure 3A:
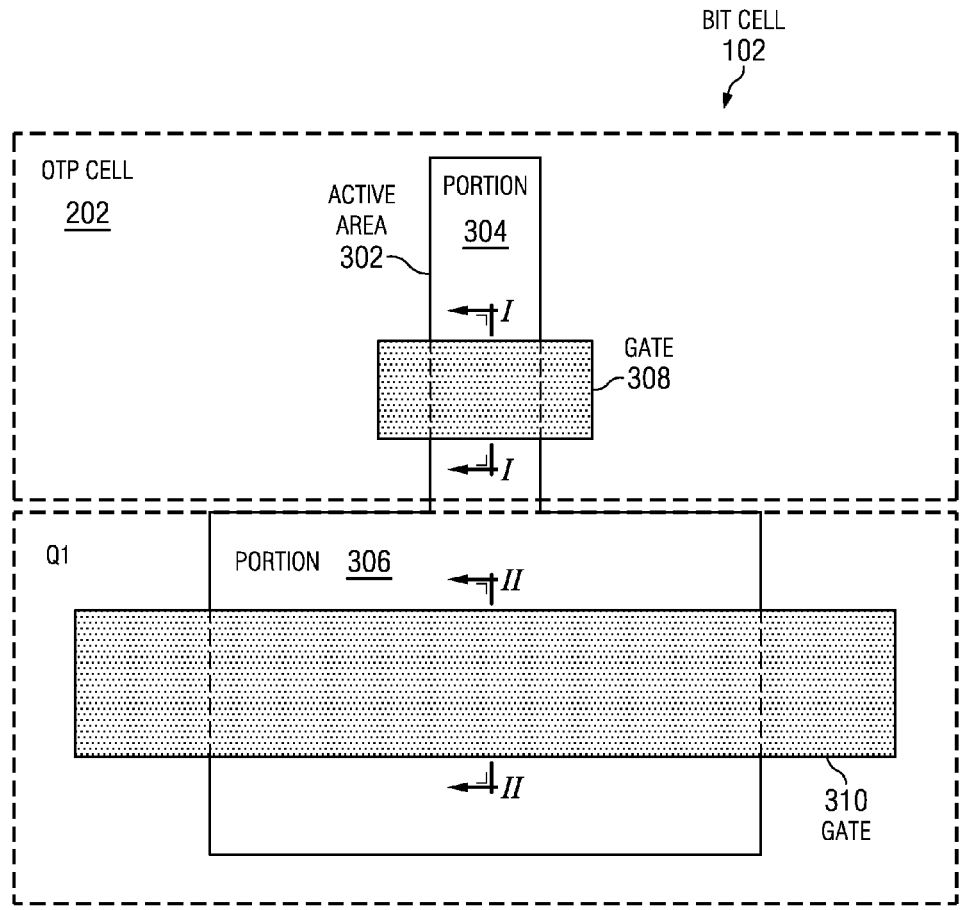
Figure 3B:
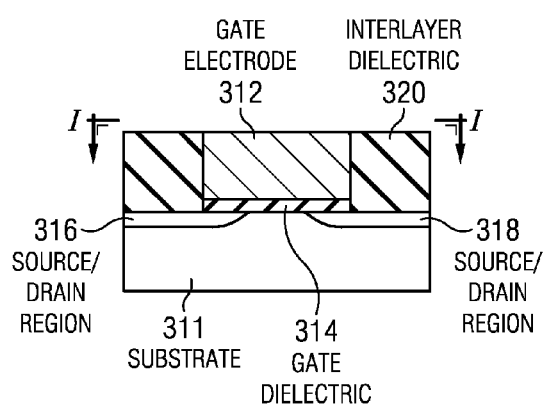
Figure 3C:
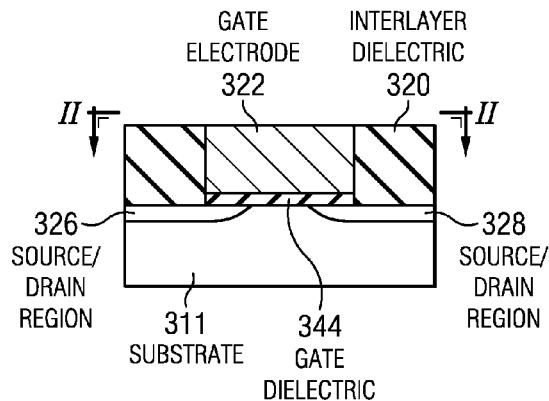
FIG. 3C is a cross-sectional view of the transistor of FIG. 2 along section line II-II.
Figure 3D:
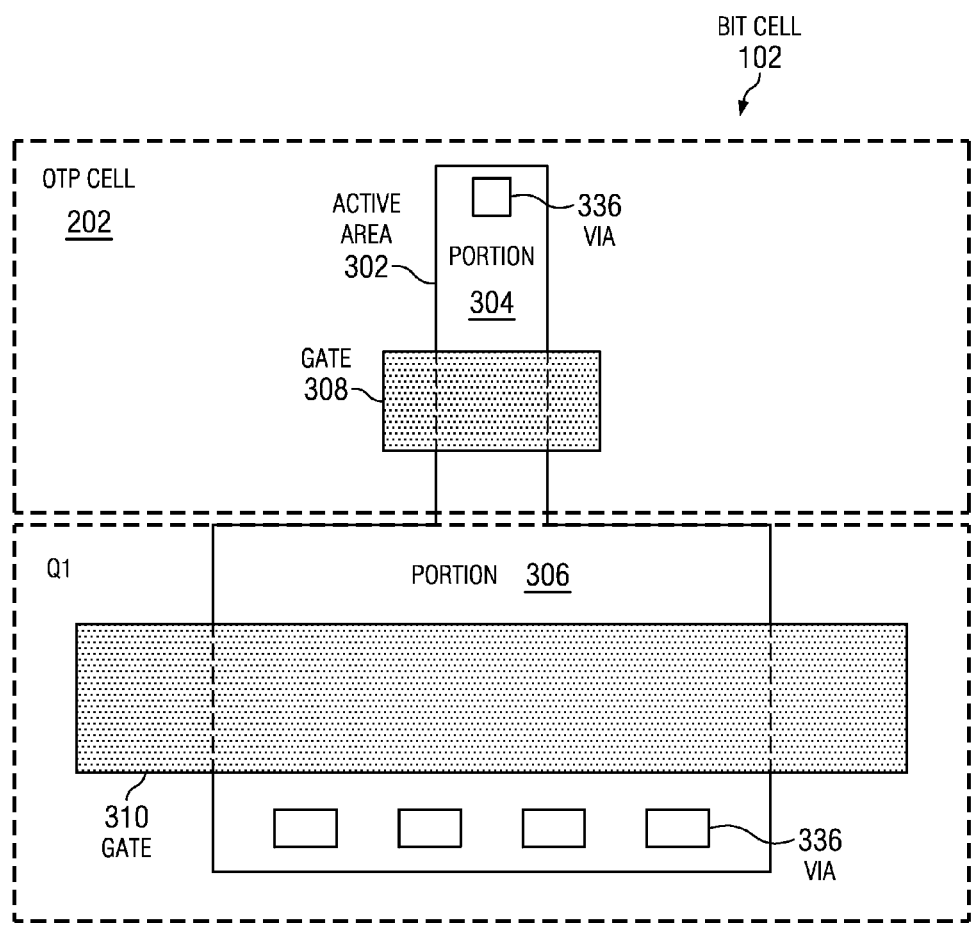
Figure 3E:
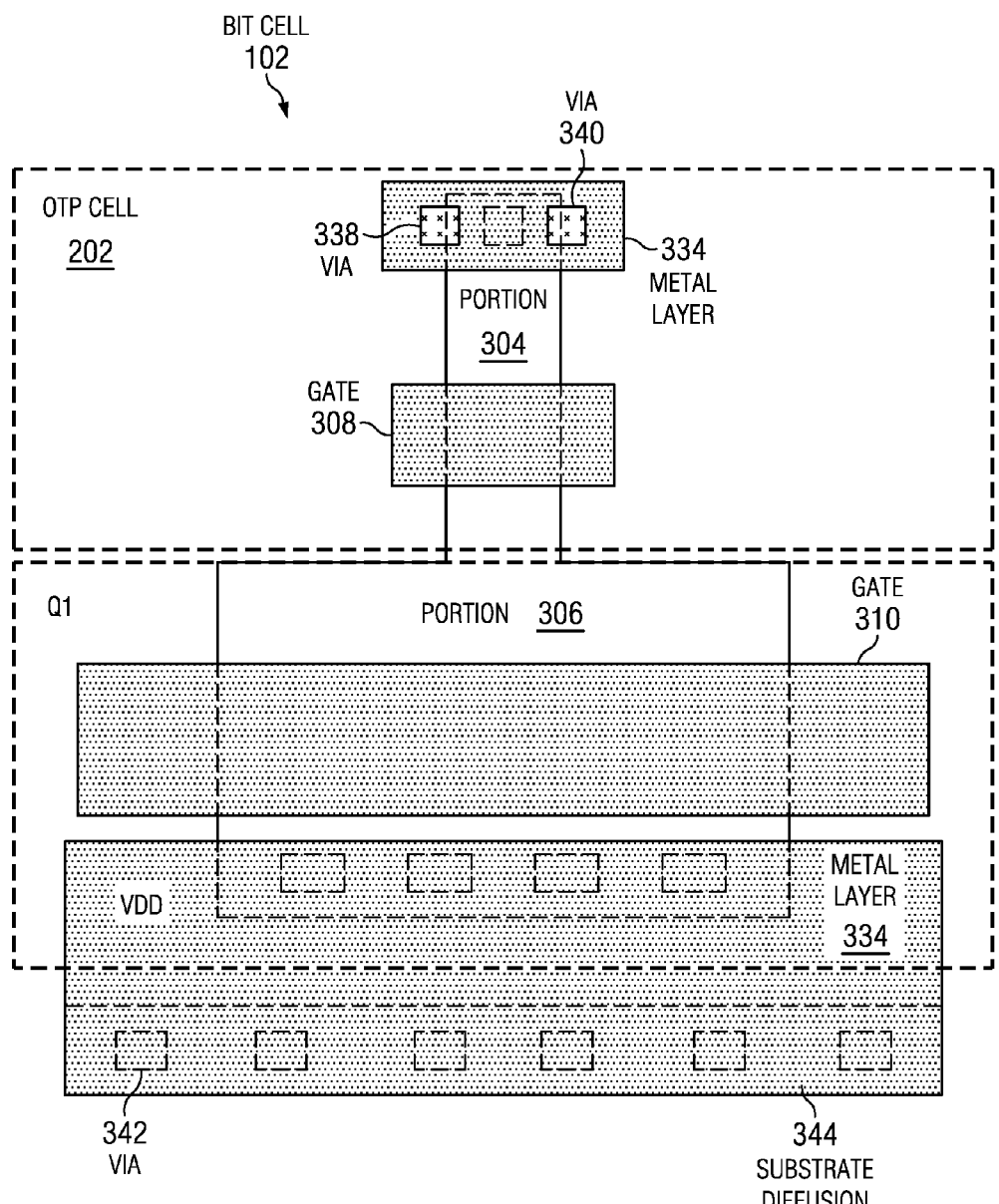
Figure 6A:
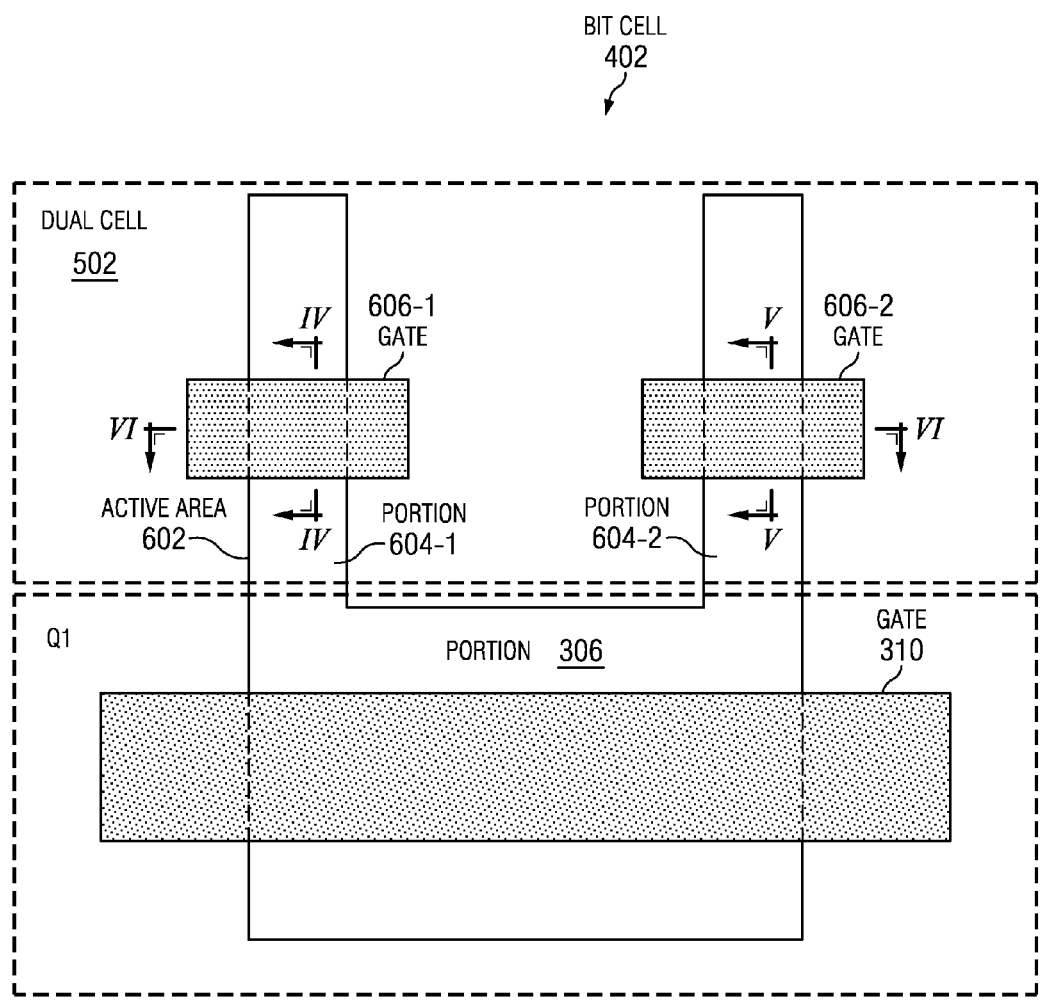
FIGS. 6A and 6E through 6G are diagrams of an example of layout of the bit cell of FIG. 5.
Figure 6B:
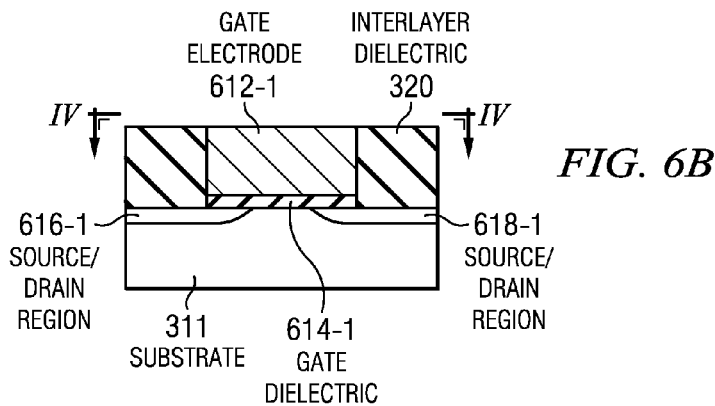
FIGS. 6B, 6C, 6D, and 6H are cross-sectional views of the dual cell of FIG. 5 along section line IV-IV, V-V, VI-VI, and VII-VII, respectively.
Figure 6C:
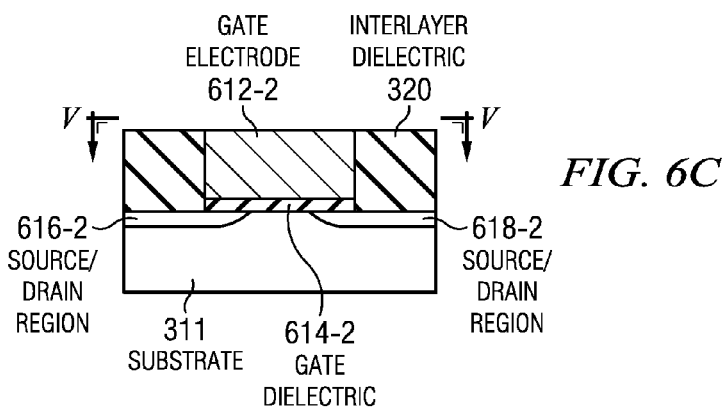
Figure 6D:
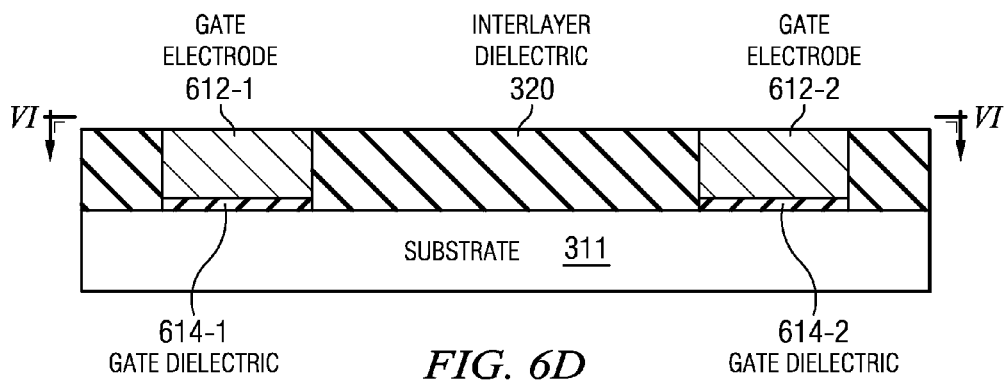
Figure 6E:
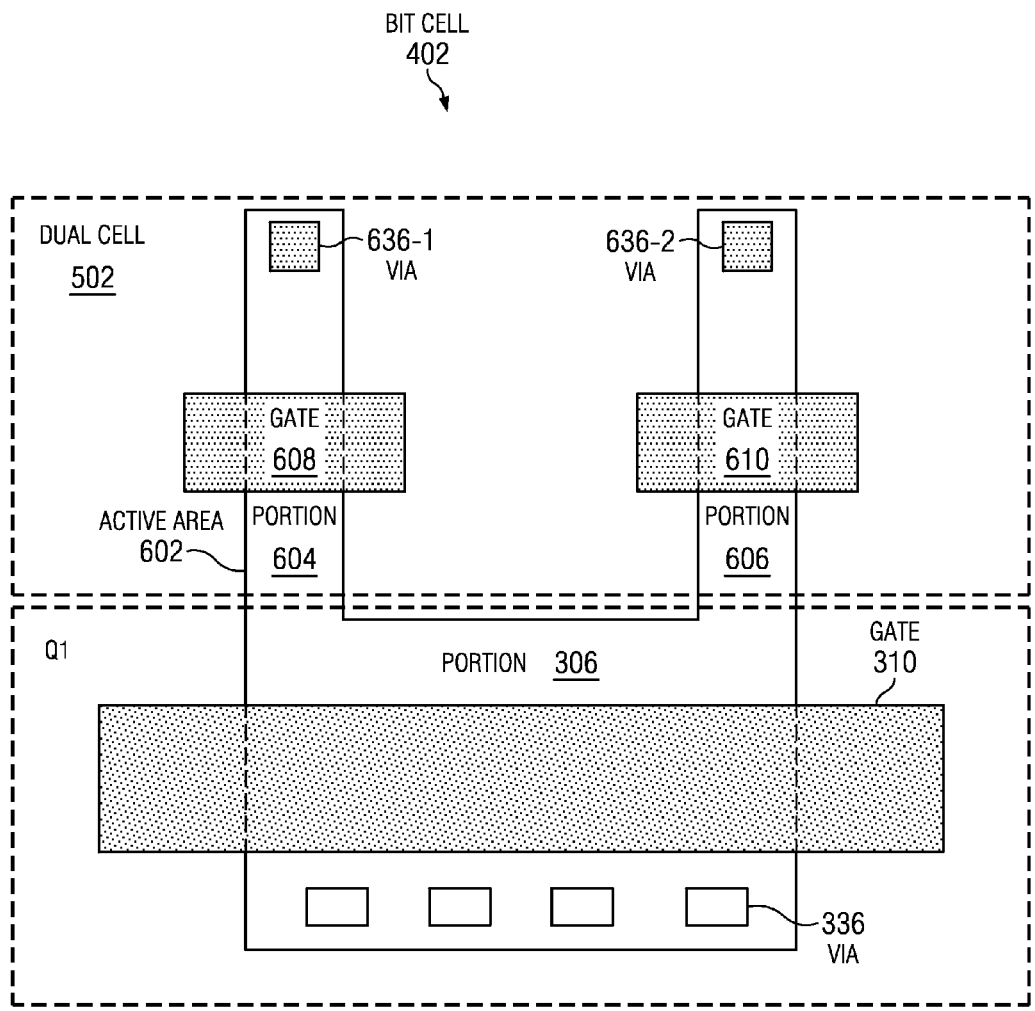
Figure 6F:
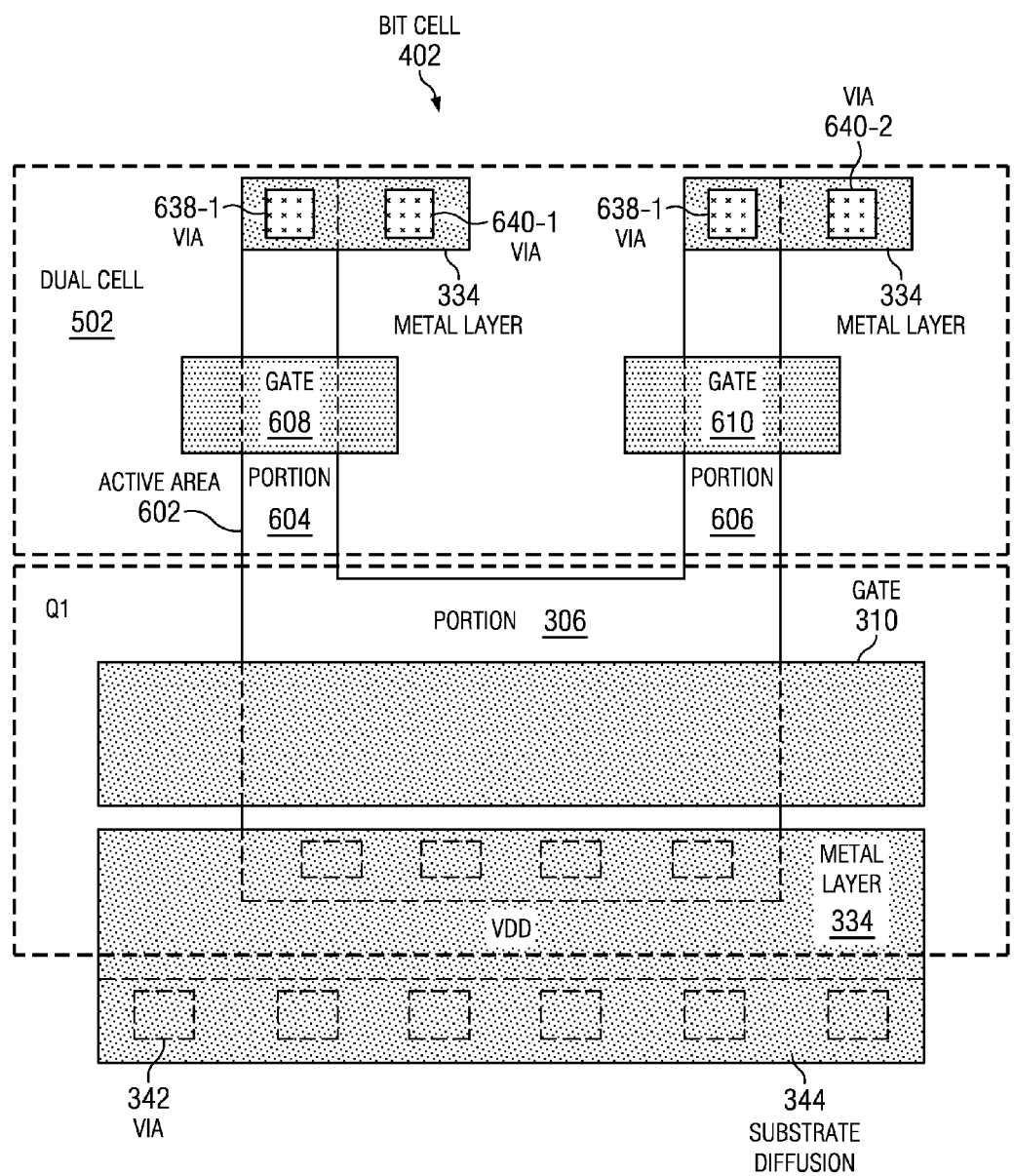
Figure 6G:
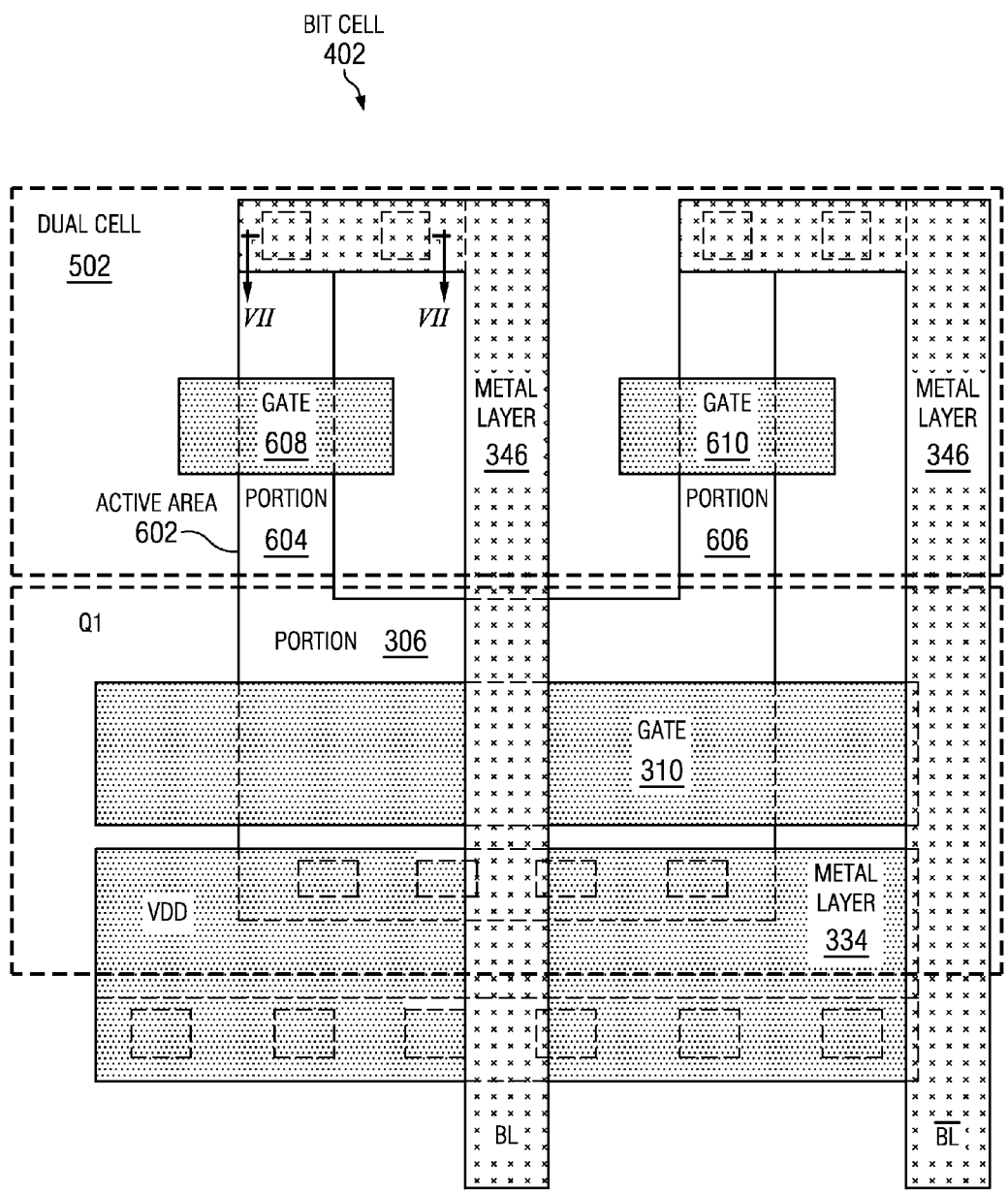
Figure 6H:
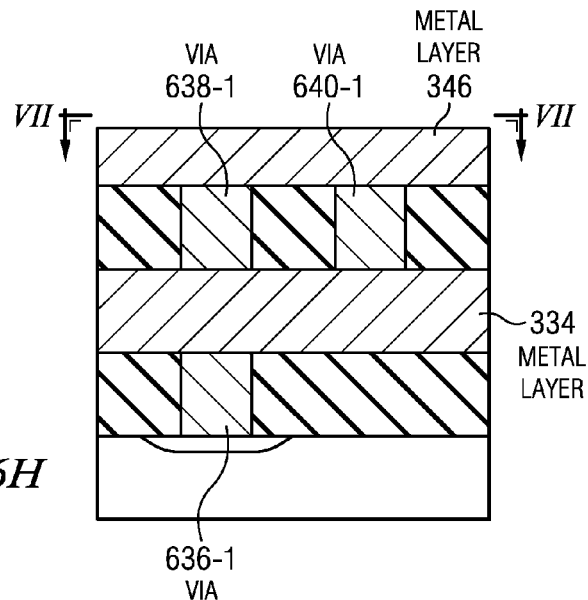

Refer now to the drawings wherein depicted elements are, for the sake of clarity, not necessarily shown to scale and wherein like or similar elements are designated by the same reference numeral through the several views.

An example of an EPROM array in accordance with an embodiment of the present invention can be seen in FIGS. 4 and 5. The EPROM generally comprises an array 400 of bit cells 402-11 to 402-NN and sense amplifiers 404-1 to 404-N. In operation, each of these bit cells 402-11 to 402-NN operates as differential cell (as opposed to single ended for bit cell 102), using bit line pairs BL1/$\overline{BL1}$, BL1/$\overline{BLN}$ and consuming slightly more area than bit cell 102. To accomplish this, the bit cell 402 has a similar structure to bit cell 102, except that OTP cell 202 is replaced by a dual cell 502 (which generally employs two separate OTP cells).

Turning to FIGS. 6A through 6H, the layout for these bit cells 402-11 to 402-NN (hereinafter 402) can be seen. As shown, the layout for transistor Q1 in bit cell 402 is similar to the layout for the transistor Q1 in bit cell 102, but the dual cell 502 is substantially different from OTP cell 202. For dual cell 502, there are two portions 604-1 and 604-2 that are generally parallel to one another and separated from one another at opposite ends of the substantially rectangular portion 306. Gates 606-1 and 606-2 are then formed over these portions 604-1 and 604-2, respectively, and are substantially aligned with one another to form two OTP transistors. These gates 606-1 and 606-2 are generally formed of a gate dielectric layer 614-1 and 614-2, respectively, (which can, for example, be silicon dioxide or a high-K dielectric like hafnium oxide) and a gate electrode 612-1 and 612-2, respectively (which may be a single or dual layer polysilicon gate) that are surrounded by a interlayer dielectric 320 (which may be silicon dioxide). The drains of each of the OTP transistors of dual cell 502 (i.e., source/drain regions 616-1 and 616-2) are electrically coupled (respectively) to the bit lines BL and bitbar line $\overline{BL}$ (which is formed by a portion of metal layer 346) through vias 636-1, 636-2, 638-1, 638-2, 640-1, and 640-2 and straps (which is generally formed by a portion of metal layer 334).

For this bit cell 502 (or bit cell 102) to function properly, it is desirable for the aspect ratio (width-to-length or W/L) of the OTP cell (i.e., 202) to the transistor Q1 should be 1:3. Because the OTP transistors that form dual cell 502 are complementary, both transistors dual cell 502 are capable of using transistor Q1 so as to allow for this compact arrangement. Moreover, because bit cell 402 is differential, a reference voltage is not generally used.

Figure 7:
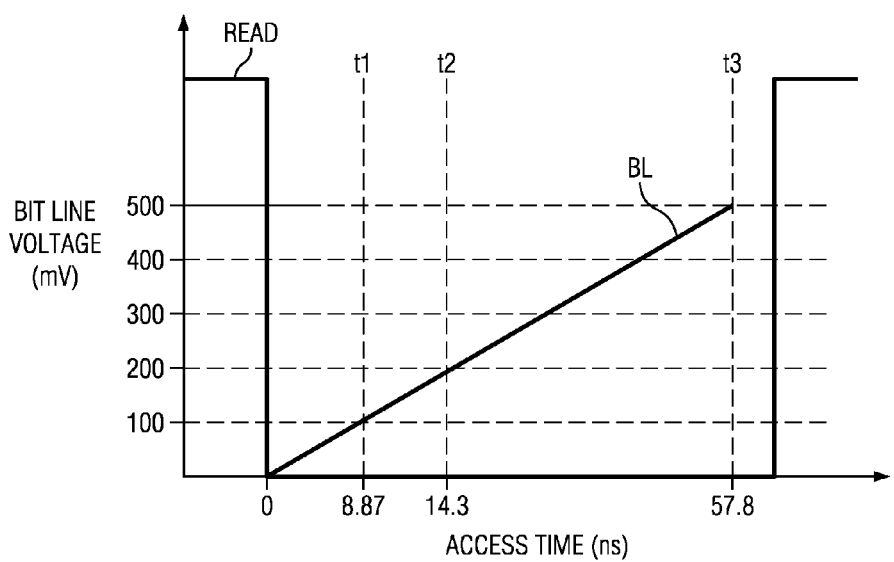
FIG. 7 is a diagram illustrating the speeds of conventional bits cells and the bit cell of FIG. 4.

To illustrate the difference in speed between bit cell 102 and bit cell 402, the graph of FIG. 7 is provided. In this example, it can be assumed that a voltage of about 100 mV is the threshold for sensing. Under these circumstances and in this example, bit cell 402 would have a read access time of about 8.87 ns (at time t1), and the read access time for bit cell 102 (in a single-ended arrangement) would be about 57.8 ns (at time t3). Additionally, if bit cell 102 is employed in a differential arrangement, the reference voltage $V_{REF}$ would be set, for example, at 100 mV and the bit line differential (between true and complement) would be increased to 200 mV because the reference voltage $V_{REF}$ is ideally set halfway between the "on" and "off" cells (i.e., $V_{BL(on)} - V_{REF} = V_{REF} - V_{BL(on)} = 100$ MV). This would, in turn, cause the charging time for the bit line BL to be increased; thus, as shown, the access time for bit cell 102 is about 14.3 ns (at time t2). Therefore, there is a dramatic improvement with bit cell 402 in terms of read access time with a small impact on area.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a substrate;
    a MOS transistor having:
        a first portion of an active area formed in the substrate that includes a first source/drain region and a second source/drain, wherein the first portion is substantially rectangular; and
        a first gate formed over the substrate between the first and second source/drain regions; and
    a dual one-time programmable (OTP) cell having:
        a second portion of the active area formed in the substrate that includes a third source/drain region and a fourth source/drain, wherein the third source/drain region is electrically coupled to the second source/drain region, and wherein the second portion is substantially rectangular;
        a third portion of the active area formed in the substrate that includes a fifth source/drain region and a sixth source/drain, wherein the fifth source/drain region is electrically coupled to the second source/drain region, and wherein the second portion is substantially rectangular, and wherein the third portion is substantially parallel to the second portion to one another, and wherein each of the second and third portions are formed adjacent to opposite ends of the first portion;
        a second gate formed over the substrate between the third and fourth source/drain regions; and
        a third gate on the substrate between the fifth and sixth source/drain regions.

2. The apparatus of claim 1, wherein each of the first, second, and third gates further comprise:
    a gate dielectric formed over the substrate; and
    a gate electrode formed over the gate dielectric.

3. The apparatus of claim 2, wherein the gate electrode further comprises polysilicon.

4. The apparatus of claim 3, wherein the apparatus further comprises a metal layer formed over the substrate that is electrically coupled to the first source/drain region of the MOS transistor so as to provide a supply voltage.

5. The apparatus of claim 4, wherein the metal layer further comprises a first metal layer, and wherein the apparatus further comprises a second metal layer formed over the substrate having a bit line and an bitbar line, wherein the bit line is electrically coupled to the fourth source/drain region, and wherein the bitbar line is electrically coupled to the sixth source/drain region.

6. The apparatus of claim 5, wherein the MOS transistor is a PMOS transistor.

7. An apparatus comprising:
    a substrate;
    a plurality of word lines;
    a plurality of pairs of bits lines, wherein each pair bit lines is generally perpendicular to each word line;
    an array of bit cells, wherein each bit cell includes:
        a MOS transistor having:
            a first portion of an active area formed in the substrate that includes a first source/drain region and a second source/drain, wherein the first portion is substantially rectangular; and
            a first gate formed over the substrate between the first and second source/drain regions, wherein the first gate is electrically coupled to at least one of the word lines; and
        a dual one-time programmable (OTP) cell having:
            a second portion of the active area formed in the substrate that includes a third source/drain region and a fourth source/drain, wherein the third source/drain region is electrically coupled to the second source/drain region, and wherein the second portion is substantially rectangular;
            a third portion of the active area formed in the substrate that includes a fifth source/drain region and a sixth source/drain, wherein the fifth source/drain region is electrically coupled to the second source/drain region, and wherein the second portion is substantially rectangular, and wherein the third portion is substantially parallel to the second portion to one another, and wherein each of the second and third portions are formed adjacent to opposite ends of the first portion;
            a second gate formed over the substrate between the third and fourth source/drain regions; and
            a third gate on the substrate between the fifth and sixth source/drain regions, wherein the second and third gates are each electrically coupled to one of the bit lines from at least one of the plurality of bit lines.

8. The apparatus of claim 7, wherein each of the first, second, and third gates further comprise:
    a gate dielectric formed over the substrate; and
    a gate electrode formed over the gate dielectric.

9. The apparatus of claim 8, wherein the gate electrode further comprises polysilicon.

10. The apparatus of claim 9, wherein the apparatus further comprises a metal layer formed over the substrate that is electrically coupled to the first source/drain region of the MOS transistor of each bit cell so as to provide a supply voltage.

11. The apparatus of claim 10, wherein the metal layer further comprises a first metal layer, and wherein the apparatus further comprises a second metal layer formed over the substrate that forms the plurality of bit line pairs.

12. The apparatus of claim 11, wherein the MOS transistor is a PMOS transistor.

* * * * *